(12) United States Patent
Schreiber et al.

(10) Patent No.: US 11,264,115 B2
(45) Date of Patent: Mar. 1, 2022

(54) INTEGRATED CIRCUIT MEMORY WITH BUILT-IN SELF-TEST (BIST)

(71) Applicant: Advanced Micro Devices, Inc., Santa Clara, CA (US)

(72) Inventors: Russell Schreiber, Austin, TX (US); Keith A. Kasprak, Lakeway, TX (US); Vance Threatt, Austin, TX (US); James A. Wingfield, Austin, TX (US); William A. Halliday, Austin, TX (US); Srinivas R. Sathu, McKinney, TX (US); Arijit Banerjee, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/027,983

(22) Filed: Sep. 22, 2020

(65) Prior Publication Data

US 2021/0407617 A1 Dec. 30, 2021

Related U.S. Application Data

(60) Provisional application No. 63/044,402, filed on Jun. 26, 2020.

(51) Int. Cl.
| | |
|---|---|
| *G11C 29/44* | (2006.01) |
| *G11C 29/12* | (2006.01) |
| *G11C 7/12* | (2006.01) |
| *G06F 12/0811* | (2016.01) |

(52) U.S. Cl.
CPC .......... *G11C 29/44* (2013.01); *G06F 12/0811* (2013.01); *G11C 7/12* (2013.01); *G11C 29/12005* (2013.01); *G11C 2029/1202* (2013.01); *G11C 2029/1204* (2013.01)

(58) Field of Classification Search
CPC ..... G11C 29/44; G11C 7/12; G11C 29/12005; G11C 2029/1204; G11C 2029/1202; G06F 12/0811
See application file for complete search history.

(56) References Cited

U.S. PATENT DOCUMENTS

| | | | | |
|---|---|---|---|---|
| 7,440,347 B1 * | 10/2008 | Vogelsang | ............. | G11C 29/02 365/149 |
| 7,660,184 B2 * | 2/2010 | Kobayashi | ............... | G11C 7/12 365/230.03 |
| 8,576,647 B2 * | 11/2013 | Yamada | ............... | G11C 29/025 365/201 |

(Continued)

*Primary Examiner* — Tri M Hoang
(74) *Attorney, Agent, or Firm* — Polansky & Associates, P.L.L.C.; Paul J. Polansky

(57) ABSTRACT

An integrated circuit includes a memory core and a built-in self-test (BIST) controller. The memory core has an array of memory cells located at intersections of a plurality of word lines and a plurality of bit line pairs. The BIST controller is coupled to the memory core and has a mission mode and a built-in self-test mode. When in the mission mode, the BIST controller performs read and write accesses using precharge on demand. When in the built-in self-test mode, the BIST controller performs a floating bit line test by draining a voltage on true and complement bit lines of a selected bit line pair and subsequently precharging the true and complement bit lines of the selected bit line pair, before reading or writing data using the true and complement bit lines of the selected bit line pair.

20 Claims, 5 Drawing Sheets

(56) References Cited

U.S. PATENT DOCUMENTS

| | | | | |
|---|---|---|---|---|
| 9,208,902 B2* | 12/2015 | Pious | ................... | G11C 29/025 |
| 9,646,659 B2* | 5/2017 | Kim | ........................ | G11C 7/08 |
| 2011/0267914 A1* | 11/2011 | Ishikura | ................... | G11C 7/06 |
| | | | | 365/208 |
| 2018/0033483 A1* | 2/2018 | Bertin | ................ | G11C 13/0002 |
| 2021/0182065 A1* | 6/2021 | Kondo | ................ | G06F 9/30076 |

* cited by examiner

INTEGRATED CIRCUIT MEMORY WITH BUILT-IN SELF-TEST (BIST)

BACKGROUND

Static random-access memory (SRAM) is a type of semiconductor memory that uses bi-stable latching circuitry to store binary bits of data. SRAM cells have the advantage of holding data without requiring a refresh. SRAM is volatile because data is lost when the memory is not powered. In an SRAM array or sub-array, an addressed memory cell is at the intersection of a selected row (identified by a word line) and a selected column (typically identified by a bit line pair having a true bit line and a complement bit line). Bit lines are typically metallic conductors disposed perpendicularly to the word lines and are physically connected to the source/drains of memory cell access transistors and are the conductors through which information is written to and read from the memory cells.

One common use for large SRAM arrays in modern integrated circuit design is as data and tag storage for data processing caches. Cache SRAM arrays are relatively large, such as 32 megabytes, and therefore can take a long time to test. In order to test large SRAM arrays efficiently, circuit designers often add special-purpose testing circuits, known as built-in self-test (BIST) circuits, that can be activated to automatically test the memory cells and access circuitry in the SRAM array and reduce overall test time. A BIST controller typically performs patterns of write and subsequent read cycles to detect failures under a variety of conditions. However, it is difficult even for BIST controllers to test all memory cells under all operating conditions that may result in a failure during normal operation in the field, such as testing of accesses after startup or other transient conditions.

Figure 1:
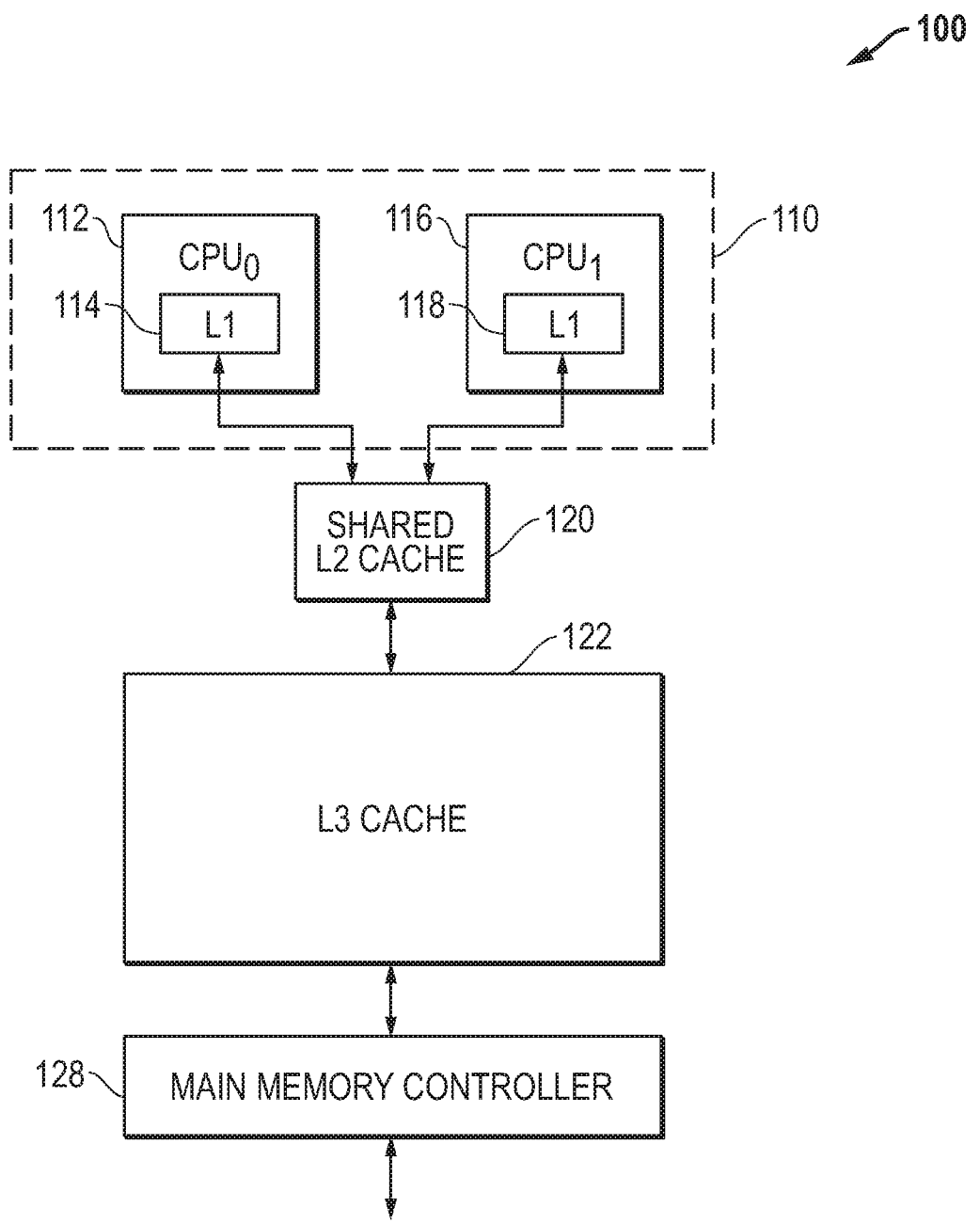
FIG. 1 illustrates in block diagram form a data processor having various caches using SRAM known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well. Additionally, the terms remap and migrate, and variations thereof, are utilized interchangeably as a descriptive term for relocating.

DETAILED DESCRIPTION OF ILLUSTRATIVE EMBODIMENTS

As will be described in detail below, an integrated circuit includes a memory core and a controller. The memory core has an array of memory cells located at intersections of a plurality of word lines and a plurality of bit line pairs. The controller is coupled to the memory core and has a mission mode and a built-in self-test mode. When in the mission mode, the controller performs read and write accesses using precharge on demand. When in the built-in self-test mode, the controller performs a floating bit line test by draining a voltage on true and complement bit lines of a selected bit line pair and subsequently precharging the true and complement bit lines of the selected bit line pair, before reading or writing data using the true and complement bit lines of the selected bit line pair.

An integrated circuit includes a memory core and a controller. The memory core has an array of memory cells located at intersections of a plurality of word lines and a plurality of bit line pairs, wherein the memory core performs precharge-on-demand. The controller is coupled to the memory core, and performs a floating bit line test of the array of memory cells by executing a sequence of draining a voltage on true and complement bit lines of the corresponding bit line pair, precharging the true and complement bit lines, writing a predetermined data bit to a predetermined memory cell using the true and complement bit lines, draining the voltage on the true and complement bit lines, precharging the true and complement bit lines, and reading a result data bit from the predetermined memory cell using the true and complement bit lines. The floating bit line test checks whether the result data bit matches the predetermined data bit.

A method of operating a memory having an array of memory cells located at intersections of a plurality of word lines and a plurality of bit line pairs includes, in a mission mode, performing read and write accesses using precharge on demand. In a built-in self-test mode, floating bit line testing is performed on the array of memory cells by draining a voltage on true and complement bit lines of a selected bit line pair and subsequently precharging the true and complement bit lines of the selected bit line pair, before reading or writing data using the true and complement bit lines of the selected bit line pair.

FIG. 1 illustrates in block diagram form a data processor 100 having various caches using SRAM known in the prior art. Data processor 100 is a single-chip multi-core processor that includes generally a CPU core complex 110, a shared L2 cache 120, an L3 cache 122, and a main memory controller 128. CPU core complex 110 includes a central processing unit (CPU) core 112 labeled "$CPU_0$" a level-one (L1) cache 114, a CPU core 116 labeled "$CPU_1$" having an L1 cache 118, a shared level-two (L2) cache 120, a level-three (L3) cache 122, and a main memory controller 128.

Shared L2 cache 120 is a shared cache that has a first processor-side bidirectional port connected to CPU core 112 over a bidirectional bus, a second processor-side bidirectional port connected to CPU core 116 over a second bidirectional bus, and a memory-side port. L3 cache 122 has a processor-side bidirectional port coupled to the memory-side bidirectional port of shared L2 cache 120, and a memory-side bidirectional port. Main memory controller 128 has a processor-side bidirectional port connected to the memory-side bidirectional port of L3 cache 130, and a memory side bidirectional port adapted to be connected to a main memory. In the illustrated example, shared L2 cache 120 is shared between CPU cores 112 and 116, but they could independently utilize separate L2 caches. Furthermore, data processor 100 could use other L2 cache and L3 cache configurations, and could include multiple cores with shared L2 caches.

In the example of FIG. 1, L1 caches 114 and 118, shared L2 cache 120, and L3 cache 122 all implement tag and data storage arrays with SRAMs so that in the aggregate, data processor 100 uses a lot of SRAM memory. Moreover, data processor 100 is capable of implementing various low-power modes with various power-saving features. For example, data processor 100 can operate at various power-performance states (P-states), each of which correspond to a separate combination of operational voltage and clock frequency. In addition, the SRAM arrays can implement a feature known as "precharge on demand". Precharge on demand allows the SRAM array to save power by saving the leakage current that would occur if both bit lines of a complementary but line pair were to be continuously precharged when the SRAM is idle. Instead, the bit lines are only precharged right before read and/or write cycles occur, but not precharged during periods of no activity. The inventors have discovered that known BIST techniques are inadequate to test marginal bit cells that may fail as a memory array that supports precharge on demand is awakened and precharge is re-applied. A further description of this problem will now be described.

Figure 2:
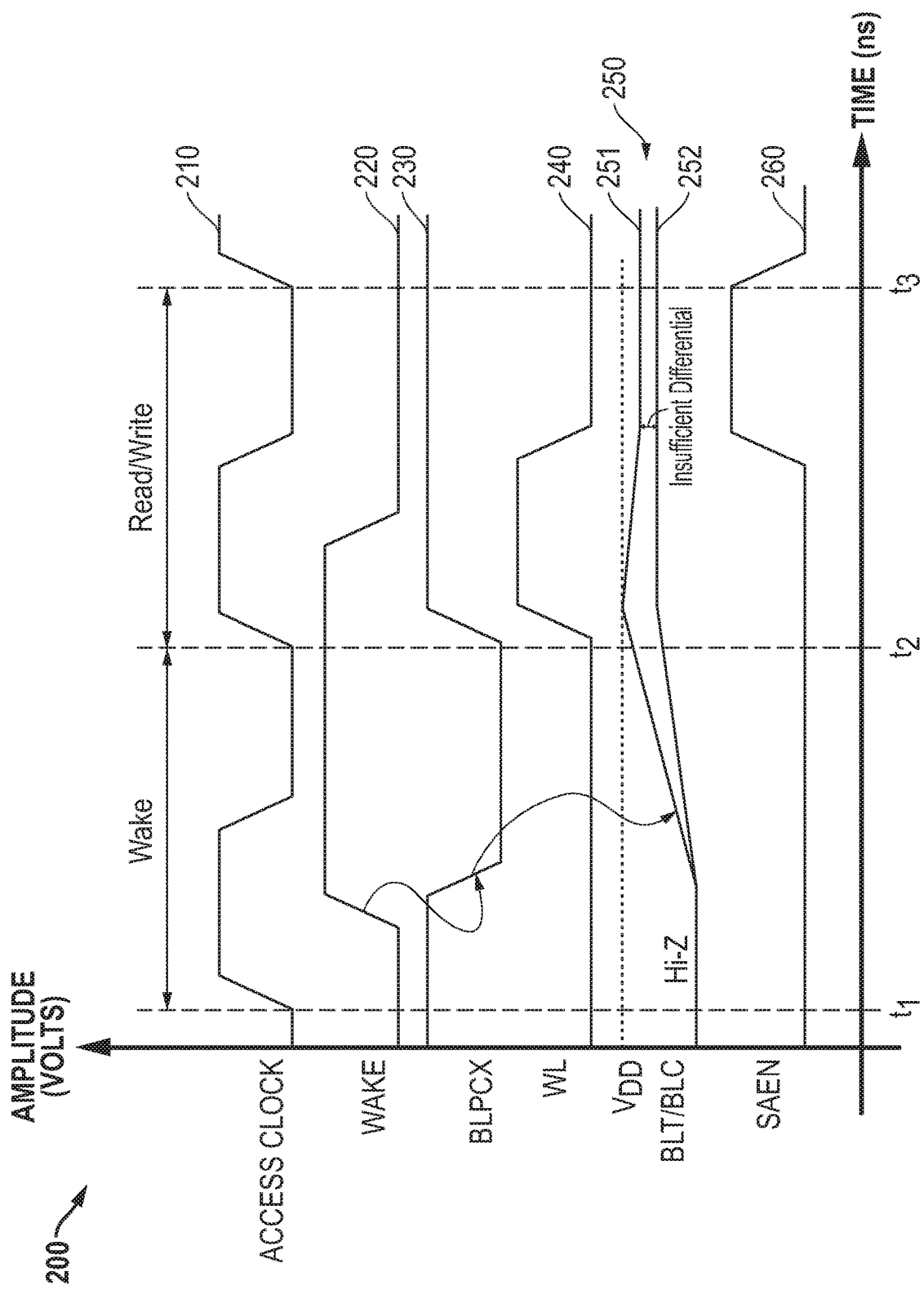
FIG. 2 illustrates a timing diagram showing various signals associated with an access to a memory cell in a precharge on demand SRAM array.

FIG. 2 illustrates a timing diagram 200 showing various signals associated with an access to a memory cell in a precharge on demand SRAM array. In FIG. 2 the horizontal axis represents time in nanoseconds (ns), and the vertical axis represents the amplitude of various signals in volts. Timing diagram 200 shows waveforms of various signals of interest, including a waveform 210 of a clock signal labeled "ACCESS CLOCK", a waveform 220 of a control signal labeled "WAKE", a waveform 230 of an active-low bit-line precharge signal labeled "BLPCX", a waveform 240 of a word line signal labeled "WL", waveforms 250 including a waveform 250 of a bit-line true signal labeled "BLT" and a waveform 251 of a bit-line complement signal labeled "BLC", and a waveform of a sense amplifier enable signal labeled "SAEN". Timing diagram 200 also shows three time points of interest, labeled "$t_1$", "$t_2$", and "$t_3$" corresponding to rising edges of the ACCESS CLOCK signal.

Before $t_1$, the memory array is in a floating bit line mode, labeled "Hi-Z", and the WAKE signal is low. BLPCX is inactive at a logic high voltage, and WL is inactive at a logic low. During long periods between accesses, in which the bit lines are floating, the voltages on BLT and BLC can float to low voltages due to leakage. These periods can be on the order of tens to hundreds of nanoseconds, but is data dependent and can be even longer depending on the pattern of ones and zeros stored in the memory cells of the column. In particular, the inventors have discovered that the low voltages can be approximately 200 millivolts (mV). The bit line signals, BLT and BLC, are at a low voltage since the lapse of time between the last precharge cycle has caused both voltages to slowly discharge to a level slightly above the ground power supply voltage, for example about 200 millivolts (mV).

Between $t_1$ and $t_2$, the memory array is in a Wake mode. The WAKE signal transitions to an active state at a logic high voltage. The rising edge of the WAKE signal causes precharge signal BLPCX to become active at a logic low. The falling edge of the BLPCX signal in turn causes the bit line precharge circuit to become active and to pull the BLT and BLC signals slowly toward a logic high voltage. In the example shown in FIG. 2, the memory array has a defect such that one bit line signal rises more slowly than the other bit line signal such that the other bit line signal fails to fully precharge to a power supply voltage labeled "$V_{DD}$", resulting in a difference in voltage between the two bit lines at time $t_2$.

Between $t_2$ and $t_3$, the memory array is in a Read/Write mode. In particular, FIG. 2 shows a read cycle. The BLPCX signal is about to transition to an inactive state coincident with the rising edge of the ACCESS CLOCK around time $t_2$. The WL signal is also activated according to the decoded row address signal to start the read access, and the WAKE signal is deactivated at a logic low voltage. In response to the rising edge of the WL signal, the accessed memory cell starts to provide a differential voltage on the bit lines according to the state of the memory cell. In this example, the state of the memory cell is a "1", which would be indicated by a positive voltage differential between the BLT and BLC signals.

However, because the memory cell has a defect, it provides an insufficient differential voltage between BLT and BLC. During the second half of the Read/Write mode, the SAEN signal is activated, causing the bit line sense amplifier to attempt to resolve the differential voltage between BLT and BLC. Because of the insufficient differential voltage, the bit line sense amplifier is incapable of correctly discriminating the state of the memory cell, causing the SRAM array to return incorrect data.

This failure mode is difficult to detect through normal built-in self-test (BIST) routines because the precharge operation is never stressed during normal BIST operation, but only during the first access of the SRAM memory after powerup because the BLT and BLC pairs are fully discharged to the level slightly above ground. The deep discharge of the BLT and BLC signals that may be encountered during precharge on demand may take many ACCESS CLOCK cycles. To test the entire memory array containing, for example 32 MB of data, the discharge period would have to be alternated with read and write cycles for at least every word line of the array and for both data states. The result would be in inordinate amount of test time that would make this failure mechanism virtually impossible to test.

The inventors have discovered that this problem can be overcome using a new technique implemented by a BIST controller. An integrated circuit subject to this problem has a memory core having an array of memory cells located at intersections of a plurality of word lines and a plurality of bit line pairs, and a controller connected to the memory core. The controller has a mission mode, i.e. a normal read and write operation mode, and a built-in self-test mode. In the mission mode, the controller performs read and write accesses using the precharge on demand feature. In the built-in self-test mode, the controller performs a floating bit line test by draining a voltage on true and complement bit lines of a selected bit line pair and subsequently precharging the true and complement bit lines of the selected bit line pair, before reading or writing data using the true and complement bit lines of the selected bit line pair. The memory core uses a new Drain cycle, which is a special cycle in which the voltages on the bit lines (e.g. BLT and BLC) are discharged as they would be after a long period after precharge is removed. Next, the memory cells are precharged in a Wake cycle. Then the memory cells are written to or read from. Thus instead of waiting long periods of time before the memory cell precharge would naturally decay, the special Drain cycle allows the controller to simulate the same conditions of a long delay and test the memory cells under this condition by configuring the write drive to pull both bit lines low.

An SRAM array capable of executing this floating bit line test using a BIST controller will now be described.

Figure 3:
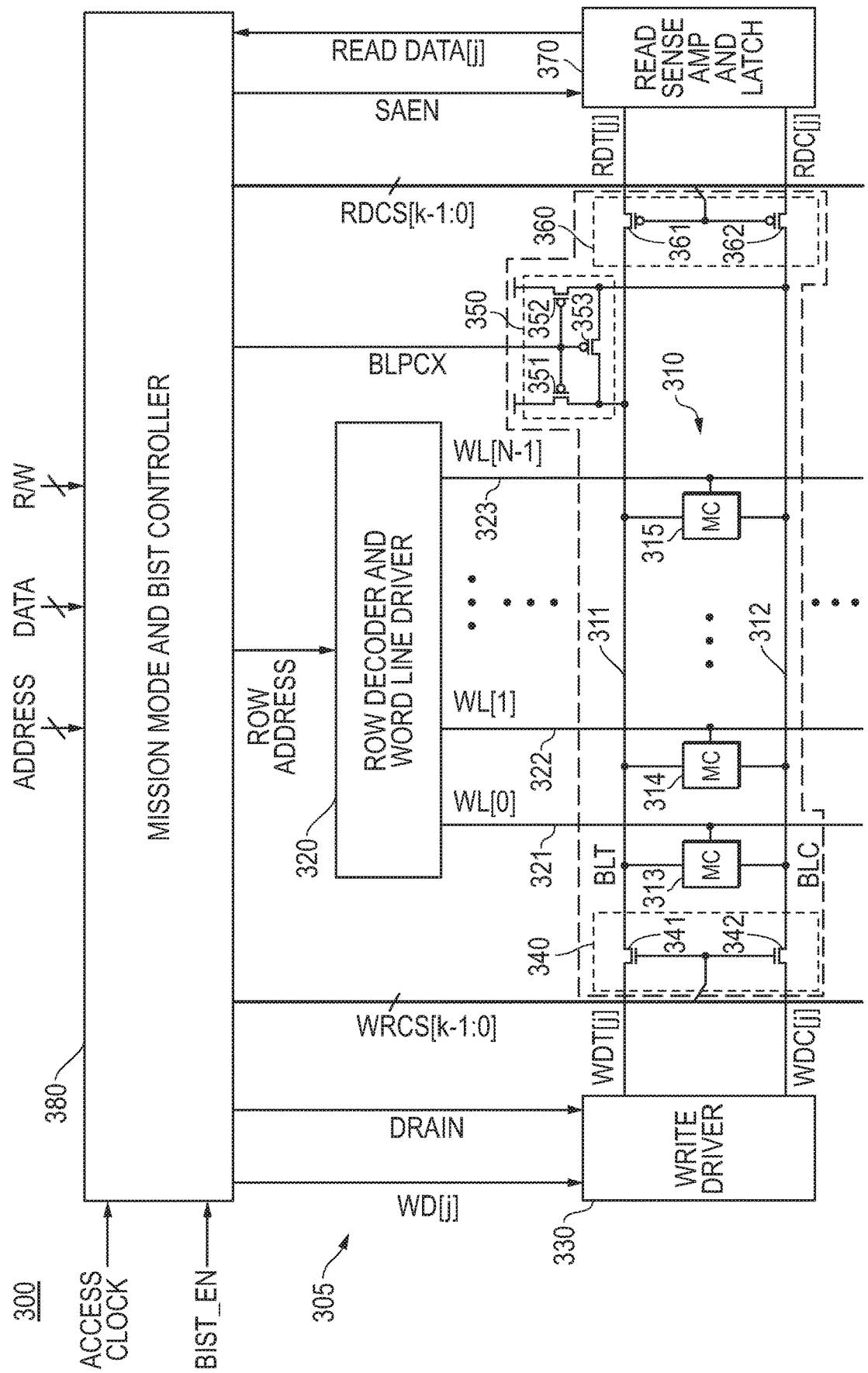
FIG. 3 illustrates in partial block diagram and partial schematic form a portion of an SRAM with a BIST mode according to some embodiments.

FIG. 3 illustrates in partial block diagram and partial schematic form a portion of an SRAM 300 with a BIST mode according to some embodiments. SRAM 300 includes generally a memory core 305 and a mission mode and BIST controller 380.

Memory core 305 includes an array 310 of memory cells, a row decoder and word line driver 320, a write driver 330, a write column select circuit 340, a bit line precharge circuit 350, a read column select circuit 360, and a read sense amplifier 370.

Array 310 is an array of M columns and N rows of memory cells including a representative $i^{th}$ column with a true bit line 311 conducting signal BLT, a complement bit line 312 conducting signal BLC, and exemplary memory cells 313, 314, and 315. Each of exemplary memory cells 313, 314, and 315 has a first input/output terminals connected to true bit line 311, a second input/output terminal connected to complement bit line 312, and a select terminal connected to a corresponding word line.

Row decoder and word line driver 320 has an input for receiving a row address, and outputs for providing word line signals to array 310 on corresponding word lines. As shown in FIG. 3, row decoder and word line driver 320 provides word line signals to N word lines, including representative word lines 321, 322, and 323 that conduct corresponding word line signals labeled "WL[0]", "WL[1]", and "WL[N−1]".

Write driver 330 has a first input for receiving a write data signal labeled "WD[j]", a second input for receiving a signal labeled "DRAIN", and outputs providing signals labeled "WDT[j]" and "WDC[j]", respectively.

Write column select circuit 340 is associated with the $i^{th}$ column and is a circuit that selectively multiplexes the outputs of write driver 330 onto the associated column, and as shown in FIG. 3, includes transistors 341 and 342 to selectively connect the output of write driver 330 to the column of memory cells shown in FIG. 3. Transistor 341 is an N-channel MOS transistor having a first source/drain terminal connected to a corresponding output of write driver 330 for receiving the WDT[j] signal, a gate for receiving one of a set of write column select signals labeled "WRCS[k−1:0]" that multiplexes the output of write driver 330 onto a selected one of k columns, and a second source/drain terminal connected to bit line 311 in array 310. Transistor 342 is an N-channel MOS transistor having a first source/drain terminal connected to a corresponding output of write driver 330, a gate for receiving the $i^{th}$ one of the WRCS[k−1:0] signals, and a second source/drain terminal connected to complement bit line 312 in array 310. Memory 300 includes other circuitry, not shown in FIG. 3, to selectively connect the WDT[j] and WDC[j] signals to one of k columns.

Bit line precharge circuit 350 is associated with the $i^{th}$ column and includes transistors 351, 352, and 353. Transistor 351 is a P-channel MOS transistor having a source connected to the positive power supply voltage terminal, a gate for receiving bit line precharge signal BLPCX, and a drain connected to true bit line 311. Transistor 352 is a P-channel MOS transistor having a source connected to the positive power supply voltage terminal, a gate for receiving bit line precharge signal BLPCX, and a drain connected to complement bit line 312. Transistor 353 is a P-channel MOS transistor having a first source/drain terminal connected to true bit line 311, a gate for receiving bit line precharge signal BLPCX, and a drain/source connected to complement bit line 312.

Read column select circuit 360 is associated with the $i^{th}$ column and is a circuit that selectively de-multiplexes that de-multiplexes the selected one of k columns onto read column lines labeled "RDT[j]" and "RDC[j]", respectively, and as shown in FIG. 3, includes transistors 361 and 362. Transistor 361 is a P-channel MOS transistor having a first source/drain terminal connected to true bit line 311, a gate for receiving an $i^{th}$ one of a set of read column select signals labeled "RDCS[k−1:0]", and a second drain/source terminal for providing the RDT[j] signal. Transistor 362 is a P-channel MOS transistor having a first source/drain terminal connected to complement bit line 312, a gate for receiving the $i^{th}$ one of the RDCS[k−1:0] signals, and a second drain/source terminal for providing the RDC[j] signal.

Read sense amplifier and latch 370 has a first input connected to the second source/drain terminal of transistor 361 for receiving the RDT[j] signal, a second input connected to the second source/drain terminal of transistor 362 for receiving the RDC[j] signal, a control input for receiving a signal labeled "SAEN", and an output for providing a signal labeled "READ DATA[j]".

Mission mode and BIST controller 380 has inputs for receiving signals labeled "ADDRESS", "DATA" and "R/W" from, e.g., a cache controller, a clock input for receiving the ACCESS CLOCK, a control input for receiving a signal labeled "BIST_EN", outputs for providing corresponding write data signals to each write driver such as exemplary write data signal WD[j] to write driver 330, the DRAIN signal to each write driver such as write driver 330, a corresponding write column select signal of a group of column select signals labeled "WRCS[k−1:0]" to each write column select circuit such as exemplary write column select circuit 340, the ROW ADDRESS to row decoder and word line driver 320, the BLPCX signal to each bit line precharge circuit such as bit line precharge circuit 350, a corresponding read column select signal to each read column select circuit such as exemplary read column select circuit 360, a corresponding sense amplifier enable signal to each sense amplifier such as the SAEN signal to sense amplifier 370, and an input for receiving a read data signal from each read sense amplifier such as read data signal READ DATA[j] from read sense amplifier and output latch 370.

In operation, SRAM 300 performs read and write cycles during a mission mode (i.e., normal operation), and BIST operations during a BIST mode using a combined mission mode and BIST controller 380.

In the mission mode, signal BIST_EN is inactive and BIST mode is disabled. Mission mode and BIST controller 380 receives read and write accesses from, e.g., a cache controller. The cache controller provides the ADDRESS signal to indicate the address of the access and the R/W signal in a logic state that corresponds to the type of access. Mission mode and BIST controller 380 may receive other control signals that are not important to understanding the relevant operation of SRAM 300 and that are not shown in FIG. 3.

SRAM 300 implements precharge on demand. Thus, when SRAM 300 is not being accessed, the BLPCX signal remains high. In response to an access, mission mode and BIST controller 380 activates the WAKE signal, which causes it to drive the BLPCX signal low, precharging all bit lines in array 310.

In the BIST mode, signal BIST_EN is active and BIST mode is enabled. Mission mode and BIST controller 380 autonomously generates test sequences to detect the presence of any failures in array 310 or in the related access circuitry, including write driver 330, write column select circuit 340, bit line precharge circuit 350, read column select circuit 360, and read sense amplifier and latch 370. It performs the BIST operations using at least two kinds of tests.

Mission mode and BIST controller 380 performs background testing of array 310 by ensuring that all memory cells can be written to both a "1" and a "0" state and then read in the correct logic state. Since SRAM 300 is a precharge-on-demand memory, it precharges array 310 before performing a series of write and subsequent read operations.

Mission mode and BIST controller 380 performs floating bit line testing of array 310 by determining whether all memory cells can operate properly starting from a fully-discharged state. As noted above, in the fully-discharged state, true and complement bit lines will discharge to around 200 mV. However to execute the floating bit line testing, mission mode and BIST controller 380 further discharges both the true and complement bit lines to ground using a drain cycle. In this way, it provides a robust testing that detects potential failures before they occur during mission mode and cause an actual loss of data or program failure.

An exemplary test sequence in floating bit line testing can be summarized with the following pseudo-code:

$$\char`\^w0,r0 \qquad [1]$$

$$\char`\^{}\text{drain,noop}(x \ a \ \text{programmable} \ \#), w1, r1, \text{drain,noop}(x \ a \ \text{programmable} \ \#), r1 \qquad [2]$$

$$\char`\^{}\text{drain,noop}(x \ a \ \text{programmable} \ \#), w0, r0, \text{drain,noop}(x \ a \ \text{programmable} \ \#), r0$$

Pseudo-code segment [1] indicates an operation including a write of an initial data value such as a binary "0" to a selected memory location, followed by a read of the same data value from the selected location. This sequence ensures that the memory cell is basically functional and sets the background data.

Pseudo-code segment [2] indicates an operation including a DRAIN cycle, followed by a programmable number of no-operation ("noop") cycles during which the array will wake up, that is precharge the bit lines, followed by a write of a subsequent data value different from the initial data value (such as a binary "1"), followed by an immediate read of the data value (to determine whether the write cycle failed). This sequence is followed by another DRAIN cycle, followed by the programmable number of no-operation cycles during which the array will wake up, followed by a read of the data value. If the first read operation passes but the second read operation fails, then mission mode and BIST controller 380 detects a floating bit line test failure.

Pseudo-code segment [3] does the opposite of pseudo-code segment [2] and indicates an operation including a DRAIN cycle, followed by the programmable number of no-operation cycles, followed by a write of the initial data value such as a binary "0", followed by an immediate read of the data value (to determine whether the write cycle failed). This sequence is followed by another DRAIN cycle, followed by the programmable number of no-operation cycles, followed by a read of the data value. If the first read operation passes but the second read operation fails, then mission mode and BIST controller 380 detects a floating bit line test failure.

In this way, mission mode and BIST controller 380 tests both basic write and read functionality, as well as memory cell and circuit weaknesses that could cause failures during operation because of the precharge on demand feature. Thus, memory 300 has improved test coverage compared to other known memories that use precharge on demand.

SRAM 300 could perform a variety of remedial actions upon detection of a failure. For example, it could cause a redundant row to be substituted for a row in which a failure is detected. It could also cause an entry to be made in a replacement cache, in which the replacement cache dynamically substitutes a redundant row for the row in which the failure occurred when an access to the row is detected. It could also just report the failure to system management firmware, which would them perform a remedial action as appropriate. If the BIST operation occurred at manufacturing test, it could also cause the integrated circuit to be rejected.

Figure 4:
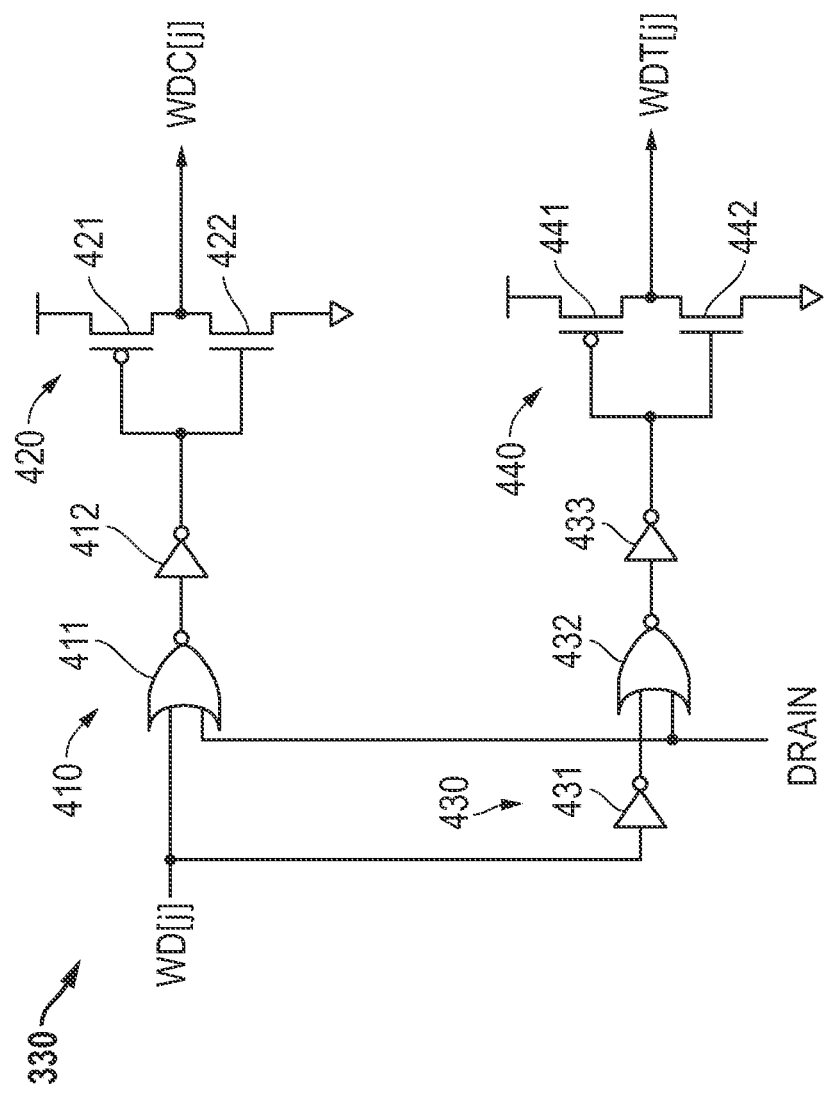
FIG. 4 illustrates in schematic form the write driver of FIG. 3 according to some embodiments.

FIG. 4 illustrates in schematic form write driver 330 of FIG. 3 according to some embodiments. Write driver 330 includes generally a predriver 410, an inverting driver 420, a predriver 430, and an inverting driver 440. Predriver 410 includes a NOR gate 411 and an inverter 412. NOR gate 411 has a first input for receiving a write data signal labeled "WD[j]", a second input for receiving the DRAIN signal, and an output. Inverter 412 has an input connected to the output of NOR gate 411, and an output. Inverting driver 420 includes transistors 421 and 422. Transistor 421 is a P-channel MOS transistor having a source connected to a positive power supply voltage terminal, a gate connected to the output of inverter 412, and a drain for providing the WDC[j] signal. Transistor 422 is an N-channel MOS transistor having a drain connected to the drain of transistor 421, a gate connected to the output of inverter 412, and a source connected to ground. Predriver 430 includes an inverter 431 a NOR gate 432, and an inverter 433. Inverter 431 has an input terminal for receiving signal WD[j], and an output. NOR gate 432 has a first input connected to the output of inverter 431, a second input for receiving the DRAIN signal, and an output. Inverter 433 has an input connected to the output of NOR gate 432, and an output. Inverting driver 440 includes transistors 441 and 442. Transistor 441 is a P-channel MOS transistor having a source connected to the positive power supply voltage terminal, a gate connected to the output of inverter 433, and a drain for providing the WDT[j] signal. Transistor 442 is an N-channel MOS transistor having a drain connected to the drain of transistor 441, a gate connected to the output of inverter 433, and a source connected to ground.

In operation, when the Drain signal is inactive (DRAIN=0), the logic low of the DRAIN signal causes NOR gates 411 and 432 to invert the voltages on their inputs. NOR gate 411 provides the complement of the WD[j] signal on its output, which is then twice inverted by inverter 412 and driver 420 to provide the complement of the WD[j] signal on the output of inverting driver 420. NOR gate 432 provides the WD[j] signal on its output due to the presence of inverter 431, which is then twice inverted by inverter 433 and driver 440 to provide the WD[j] signal on the output of inverting driver 440. Thus, if WD[j]=0, then BLT=1 and BLC=0, and if WD[j]=1, then BLT=0 and BLC=1.

During a Drain cycle (DRAIN=1), the logic high of the DRAIN signal forces the outputs of NOR gates 411 and 432 to be a logic low. Inverters 412 and 433 provide a logic high on their outputs in response to the logic lows on their inputs. Drivers 420 and 440 are inverting drivers that provide both the WDT[j] and WDC[j] signals at logic low voltages in response to the logic high voltages on their inputs. In this way, write driver 330 discharges the voltages on both WDT[j] and WDC[j] to ground during the Drain cycle.

Thus, mission mode and BIST controller 380 of FIG. 3 leverages the existing word line drivers to quickly discharge both the true and complement bit lines of each bit line pair during Drain cycle with just a small increase in circuit area, i.e. by changing pre-existing inverters into NOR gates. The inventors believe that this can be accomplished for more contemporary CMOS write drivers within the pitch of the associated columns of memory cells, thus not growing the size of the array.

In some embodiments, transistors 422 and 442 can be connected, selectively or always, to a voltage below ground to support boosted word lines. This operation does not impact the new Drain cycle.

Figure 5:
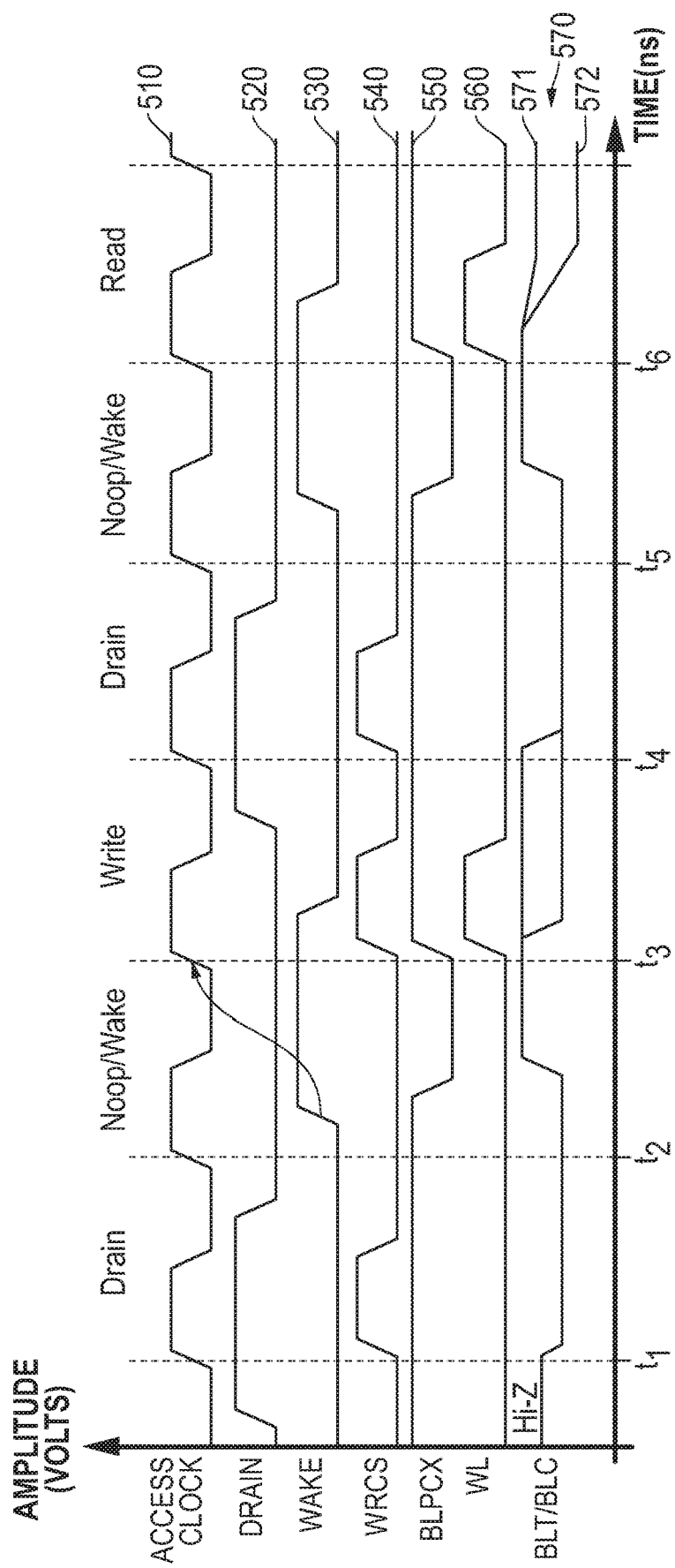
FIG. 5 illustrates a timing diagram of a floating bit line test performed by the SRAM of FIG. 3 according to some embodiments.

FIG. 5 illustrates a timing diagram 500 of a floating bit line test performed by SRAM 300 of FIG. 3 according to some embodiments. In FIG. 5 the horizontal axis represents time in ns, and the vertical axis represents the amplitude of various signals in volts. Timing diagram 500 shows waveforms of various signals of interest, including a waveform 510 of the ACCESS CLOCK signal, a waveform 520 of the DRAIN signal, a waveform 530 of the WAKE signal, a waveform 540 of the WRCS signal, a waveform 550 of the BLPCX signal, a waveform 560 of the WL signal, and waveforms 570 including a waveform 571 of the BLT signal and a waveform 572 of the BLC signal. Timing diagram 500 also shows six time points of interest, labeled "$t_1$", "$t_2$", "$t_3$", "$t_4$", "$t_5$", and "$t_6$" corresponding to rising edges of the ACCESS CLOCK signal and defining different cycles of the test.

Before $t_1$, SRAM 300 is not being accessed, and the bit lines are not being precharged and are floating in the Hi-Z state. Timing diagram 500 shows that both bit lines have discharged because of the lapse of time since the last precharge cycle, and the voltages on both the BLT signal and the BLC signal have discharged to approximately 200 mV. Each of the WAKE and WL signals is inactive at a logic low, and the BLPCX signal is inactive at a logic high.

Prior to $t_1$, mission mode and BIST controller 380 activates the DRAIN signal in preparation for a Drain cycle, which occurs between $t_1$ and $t_2$. During the Drain cycle, mission mode and BIST controller 380 activates the WRCS signal, causing write driver 330 to drive both BLT and BLC to a low voltage, substantially all the way to ground. The low voltage ensures that it is testing the worst-case starting condition by lowering the voltage on the BLT and BLC signals by approximately 200 mV for extra margin. Mission mode and BIST controller 380 subsequently de-activates the DRAIN signal.

Between $t_2$ and $t_3$, SRAM 300 provides one Wake cycle, optionally followed by one or more no-operation (Noop) cycles that would ensure that the WAKE signal setup time to the access clock is sufficient. Mission mode and BIST controller 380 activates the WAKE signal internally, which causes it to activate the BLPCX signal at a logic low to enable the bit line precharge circuits of all columns in SRAM 300. The falling edge of the BLPCX signal in turn causes the bit line precharge circuits of all columns in SRAM 300 to become active and to pull the BLT and BLC signals to a logic high voltage. In the example shown in FIG. 5, the memory cell does not have a defect such that both the BLT and BLC signals rise rapidly and reach a voltage of approximately the power supply voltage $V_{DD}$.

Between $t_3$ and $t_4$, mission mode and BIST controller 380 performs a Write cycle. It deactivates the BLPCX signal at a logic high shortly after the rising edge of the ACCESS CLOCK transitions high at time $t_3$. It also activates the WL signal according to the decoded row address signal and the WRCS signal according to the decoded column address to start a write access. Coincident with the rising edge of the WL signal, write driver 330 drives the voltages on the bit lines according to the state of the data bit to be written to the accessed memory cell. In this example, the data bit is a "0", which is indicated by a positive voltage differential between the BLT and BLC signals.

Prior to $t_4$, mission mode and BIST controller 380 activates the DRAIN signal in preparation for a Drain cycle, which occurs between $t_4$ and $t_5$. During the Drain cycle, mission mode and BIST controller 380 activates the WRCS signal, causing write driver 330 to drive both BLT and BLC to a low voltage, substantially all the way to ground. The low voltage ensures that it is testing the worst-case starting condition by lowering the voltage on the BLT and BLC signals by approximately 200 mV for extra margin. Mission mode and BIST controller 380 subsequently de-activates the WRCS and DRAIN signals.

Between $t_5$ and $t_6$, SRAM 300 again provides one Wake cycle, optionally followed by Noop cycles that would ensure that the WAKE signal setup time to the access clock is sufficient. Mission mode and BIST controller 380 activates the WAKE signal internally, which causes it to activate the BLPCX signal at a logic low to enable the bit line precharge circuits of all columns in SRAM 300. The falling edge of the BLPCX signal in turn causes the bit line precharge circuits of all columns in SRAM 300 to become active and to pull the BLT and BLC signals to a logic high voltage. In the example shown in FIG. 5, the memory cell does not have a defect such that both the BLT and BLC signals rise rapidly and reach a voltage of approximately the power supply voltage $V_{DD}$.

After $t_6$, mission mode and BIST controller 380 performs a Read cycle. It deactivates the BLPCX signal at a logic high shortly after the rising edge of the ACCESS CLOCK transitions high at time $t_6$. It also activates the WL signal according to a decoded row address signal and the RDCS signal according to the decoded column address to start a read access. Coincident with the rising edge of the WL signal, mission mode and BIST controller 380 activates the RDCS[k−1] and SAEN signals for the selected column or columns (not shown in FIG. 5), and the accessed memory cell drives a differential voltage on the BLT and BLC signals according to their logic states. As shown in FIG. 5, the accessed memory cell now provides a sufficient differential voltage between the BLT and BLC signals for read sense amplifier and latch 370 to sense the correct voltage. However, mission mode and BIST controller 380 has detected this condition without waiting a large number of cycles, making floating bit line testing of the entire array feasible.

SRAM 300 or any portions thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, floating bit line testing was described above with reference to testing a single memory cell in a single column; various embodiments of the mission mode and BIST controller will test many memory cells from respective columns in parallel. In the exemplary embodiments, the mission mode controller and BIST controller were combined into a single controller, but in other embodiments, they can be separated in different circuits. The BIST controller can performs floating bit line testing along with other types of testing, such as data-dependent testing by writing certain patterns of data to the memory array, in which reads or writes of certain data patterns in columns may induce failures in adjacent columns. These additional forms of memory testing are well known in the art and therefore have not been described in detail. An SRAM with floating bit line testing as described herein can be used in a variety of types of integrated circuits, including microprocessors, microcontrollers, digital signal processors (DSPs), application-specific integrated circuits (ASICs), single-chip SRAMs, and the like. The BIST operations can be performed at a variety of times during the useful life of the integrated circuit, including probe testing, final testing, during operation in the field, in the laboratory during failure analysis, and the like.

Accordingly, it is intended by the appended claims to cover all modifications of the disclosed embodiments that fall within the scope of the disclosed embodiments.

What is claimed is:

1. An integrated circuit comprising:
   a memory core having an array of memory cells located at intersections of a plurality of word lines and a plurality of bit line pairs; and
   a controller coupled to said memory core having a mission mode and a built-in self-test mode, wherein when in said mission mode, said controller performs read and write accesses using precharge on demand, and when in said built-in self-test mode, said controller performs a floating bit line test by draining a voltage on true and complement bit lines of a selected bit line pair and subsequently precharging said true and complement bit lines of said selected bit line pair, before reading or writing data using said true and complement bit lines of said selected bit line pair.

2. The integrated circuit of claim 1, wherein before performing said floating bit line test, said controller further performs a background test of memory cells in said array of memory cells without draining said voltage on said true and complement bit lines of said selected bit line pair before reading or writing data using said true and complement bit lines of said selected bit line pair.

3. The integrated circuit of claim 1, wherein said memory core comprises a plurality of write driver circuits corresponding to different ones of said plurality of bit line pairs, each of said plurality of write driver circuits comprising:
   a first predriver for providing a first predrive signal in a logic high state when either a drain signal is active, or a write data signal is active, and in a logic low state otherwise;
   a first driver having an input for receiving said first predrive signal, and an output coupled to said complement bit line;
   a second predriver for providing a second predrive signal in said logic high state when either said drain signal is active, or a complement of said write data signal is active, and in said logic low state otherwise; and
   a second driver having an input for receiving said second predrive signal, and an output coupled to said true bit line.

4. The integrated circuit of claim 3, wherein:
   said first predriver comprises:
      a first NOR gate having a first input for receiving said write data signal, a second input for receiving said drain signal, and an output; and
      a first inverter having an input coupled to said output of said first NOR gate, and an output for providing said first predrive signal, and
   said second predriver comprises:
      a second inverter having an input for receiving said write data signal, and an output;
      a second NOR gate having a first input coupled to said output of said second inverter, a second input for receiving said drain signal, and an output; and
      a third inverter having an input coupled to said output of said second NOR gate, and an output for providing said second predrive signal.

5. The integrated circuit of claim 1, wherein said memory core comprises a plurality of precharge circuits corresponding to different ones of said plurality of bit line pairs, each of said plurality of precharge circuits comprising:
   a first transistor having a source coupled to a power supply voltage terminal, a gate for receiving a precharge signal, and a drain coupled to a true bit line of a corresponding bit line pair;
   a second transistor having a source coupled to said power supply voltage terminal, a gate for receiving said precharge signal, and a drain coupled to a complement bit line of said corresponding bit line pair; and
   a third transistor having a first source/drain terminal coupled to said true bit line of said corresponding bit line pair, a gate for receiving said precharge signal, and a second source/drain terminal coupled to said complement bit line of said corresponding bit line pair.

6. The integrated circuit of claim 1, wherein said controller drains said voltage on said true and complement bit lines of said selected bit line pair by discharging said true and complement bit lines of said selected bit line pair to ground.

7. The integrated circuit of claim 1, wherein the integrated circuit is a data processor and said memory core is a portion of a cache.

8. An integrated circuit comprising:
   a memory core having an array of memory cells located at intersections of a plurality of word lines and a plurality of bit line pairs, wherein said memory core performs precharge-on-demand; and
   a controller coupled to said memory core for performing a floating bit line test of said array of memory cells by executing a sequence of:
      draining a voltage on true and complement bit lines of said corresponding bit line pair;
      precharging said true and complement bit lines;
      writing a predetermined data bit to a predetermined memory cell using said true and complement bit lines;
      draining said voltage on said true and complement bit lines;
      precharging said true and complement bit lines; and
      reading a result data bit from said predetermined memory cell using said true and complement bit lines,
   wherein said floating bit line test passes in response to said result data bit matching said predetermined data bit.

9. The integrated circuit of claim 8, wherein:
in response to an access to said array of memory cells, said memory core precharges an accessed bit line pair, and in response to no access to said array of memory cells, said memory core disables a precharge of all of said plurality of bit line pairs.

10. The integrated circuit of claim 8, wherein said memory core comprises a plurality of precharge circuits corresponding to different ones of said plurality of bit line pairs, each of said plurality of precharge circuits comprising:
a first transistor having a source coupled to a power supply voltage terminal, a gate for receiving a precharge signal, and a drain coupled to a first bit line of a corresponding bit line pair;
a second transistor having a source coupled to said power supply voltage terminal, a gate for receiving said precharge signal, and a drain coupled to a second bit line of said corresponding bit line pair; and
a third transistor having a first source/drain terminal coupled to said first bit line of said corresponding bit line pair, a gate for receiving said precharge signal, and a second source/drain terminal coupled to said second bit line of said corresponding bit line pair.

11. The integrated circuit of claim 10, wherein said memory core comprises, for each of said plurality of bit line pairs:
a write driver for driving true and complement write data lines to opposite logic states according to a logic state of a write data signal; and
a write column select circuit for selectively coupling said true and complement write data lines to said true and complement bit lines, respectively, of said corresponding bit line pair during a write cycle.

12. The integrated circuit of claim 11, wherein said write driver comprises:
a first predriver for providing a first predrive signal in a logic high state when either a drain signal is active, or said write data signal is active, and in a logic low state otherwise;
a first driver having an input for receiving said first predrive signal, and an output coupled to said complement bit line;
a second predriver for providing a second predrive signal in said logic high state when either said drain signal is active, or a complement of said write data signal is active, and in said logic low state otherwise; and
a second driver having an input for receiving said second predrive signal, and an output coupled to said true bit line.

13. The integrated circuit of claim 11, wherein said memory core comprises, for each of said plurality of bit line pairs:
a read column select circuit for selectively coupling true and complement bit lines to said true and complement read data lines during a read cycle; and
a read sense amplifier for sensing a differential voltage between said true and complement read data lines and providing a read data signal in response.

14. The integrated circuit of claim 8, wherein:
said controller performs said floating bit line test by providing a corresponding row address for each of said plurality of word lines; and
said memory core further includes a row decoder and word line driver coupled to said controller for activating a selected word line in response to said corresponding row address.

15. The integrated circuit of claim 8, wherein when in a mission mode:
in response to receiving a write access, said controller executes a sequence of:
precharging said true and complement bit lines; and
writing a data bit to a memory cell selected by said write access using said true and complement bit lines,
in response to receiving a read access, said controller executes a sequence of:
precharging said true and complement bit lines; and
reading said data bit from a memory cell selected by said read access using said true and complement bit lines, and
in response to not receiving either a read or a write access, disabling precharging of said true and complement bit lines for all bit line pairs in said array of memory cells.

16. A method of operating a memory having an array of memory cells located at intersections of a plurality of word lines and a plurality of bit line pairs, comprising:
in a mission mode, performing read and write accesses using precharge on demand; and
in a built-in self-test mode, performing floating bit line testing on said array of memory cells by draining a voltage on true and complement bit lines of a selected bit line pair and subsequently precharging said true and complement bit lines of said selected bit line pair, before reading or writing data using said true and complement bit lines of said selected bit line pair.

17. The method of claim 16, wherein said performing read and write accesses using precharge on demand in said mission mode comprises:
in response to receiving an access to a predetermined memory cell during said mission mode, precharging said true and complement bit lines of a selected bit line pair and subsequently accessing a data bit in said predetermined memory cell using said true and complement bit lines of said selected bit line pair; and
in response to not receiving either a read or a write access during said mission mode, disabling precharging of true and complement bit lines for all bit line pairs in said array of memory cells.

18. The method of claim 16, wherein said performing floating bit line testing comprises:
draining said voltage on said true and complement bit lines of said selected bit line pair;
precharging said true and complement bit lines;
writing a predetermined data bit to a predetermined memory cell using said true and complement bit lines;
draining said voltage on said true and complement bit lines;
precharging said true and complement bit lines; and
reading a result data bit from said predetermined memory cell using said true and complement bit lines.

19. The method of claim 18, wherein said draining said voltage on said true and complement bit lines of said corresponding bit line pair comprises:
discharging said true and complement bit lines to ground.

20. The method of claim 16, further comprising:
in said built-in self-test mode, performing background testing of said selected bit line pair without draining said voltage on said true and complement bit lines of said selected bit line pair before reading or writing said data using said true and complement bit lines of said selected bit line pair.

* * * * *